United States Patent
Lim et al.

(10) Patent No.: US 9,337,433 B2
(45) Date of Patent: May 10, 2016

(54) METHOD AND APPARATUS FOR MANUFACTURING FLEXIBLE DISPLAY DEVICE

(71) Applicant: SAMSUNG DISPLAY CO., LTD., Yongin, Gyeonggi-Do (KR)

(72) Inventors: Young-In Lim, Yongin (KR); Kyu-Ho Jung, Yongin (KR); Sang-Hee Choi, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 62 days.

(21) Appl. No.: 14/079,953

(22) Filed: Nov. 14, 2013

(65) Prior Publication Data
US 2014/0138009 A1   May 22, 2014

(30) Foreign Application Priority Data
Nov. 19, 2012 (KR) ........................ 10-2012-0131185

(51) Int. Cl.
| | | |
|---|---|---|
| *H05K 13/00* | (2006.01) | |
| *H01L 51/00* | (2006.01) | |
| *H01L 51/56* | (2006.01) | |
| *G06F 1/16* | (2006.01) | |
| *G02F 1/13* | (2006.01) | |
| *G02F 1/1333* | (2006.01) | |
| *H01L 27/32* | (2006.01) | |

(52) U.S. Cl.
CPC ............ *H01L 51/0097* (2013.01); *H01L 51/56* (2013.01); *G02F 1/1303* (2013.01); *G02F 1/133305* (2013.01); *G06F 1/1637* (2013.01); *G06F 2203/04103* (2013.01); *H01L 27/3244* (2013.01); *H01L 2251/5323* (2013.01); *Y02E 10/549* (2013.01); *Y10T 156/10* (2015.01); *Y10T 156/17* (2015.01)

(58) Field of Classification Search
CPC ............... G02F 1/1333; G02F 1/1303; G02F 1/133305; G06F 1/1637; H01L 51/0097; H01L 51/56; H01L 2251/5323; H01L 27/3244; Y10T 156/10; Y10T 156/17
USPC ......... 156/538, 160, 556, 563, 580, 443, 475; 361/679.01
See application file for complete search history.

(56) References Cited

U.S. PATENT DOCUMENTS

| | | | |
|---|---|---|---|
| 2004/0089415 A1* | 5/2004 | Byun et al. ................... | 156/285 |
| 2010/0253902 A1* | 10/2010 | Yamazaki et al. ............ | 349/158 |
| 2014/0002973 A1* | 1/2014 | Lee et al. ................ | 361/679.01 |

FOREIGN PATENT DOCUMENTS

| | | |
|---|---|---|
| JP | 2001-222230 A | 8/2001 |
| JP | 2010-156784 A | 7/2010 |
| KR | 10-2003-0071439 A | 9/2003 |
| KR | 10-2011-0124534 A | 11/2011 |

\* cited by examiner

*Primary Examiner* — Jacob T Minskey
*Assistant Examiner* — Vishal I Patel
(74) *Attorney, Agent, or Firm* — Lee & Morse, P.C.

(57) ABSTRACT

A method of manufacturing a flexible display device includes a first step of providing a three-dimensional cover window having a flat portion, and a curved portion that is bent in a third direction intersecting a first direction of the flat portion while extending to a second direction intersecting the first direction at both sides of the first direction, and a second step of attaching by a line contact at least one of an adhesive film, a touch panel, and a flexible display panel that are stacked at an inner surface of the cover window.

18 Claims, 14 Drawing Sheets

METHOD AND APPARATUS FOR MANUFACTURING FLEXIBLE DISPLAY DEVICE

CROSS-REFERENCE TO RELATED APPLICATION

This application claims priority to and the benefit of Korean Patent Application No. 10-2012-0131185 filed in the Korean Intellectual Property Office on Nov. 19, 2012, the entire contents of which are incorporated herein by reference.

BACKGROUND

1. Field

Embodiments relate to a method and apparatus for manufacturing a flexible display device.

2. Description of the Related Art

A flexible display device may display an image at a front surface and a side surface using a flexible display panel. The flexible display device can be variously applied to mobile equipment such as a mobile phone, an ultra mobile personal computer (PC), an electronic book, and an electronic newspaper.

The above information disclosed in this Background section is only for enhancement of understanding of the background of the described technology and therefore it may contain information that does not form the prior art that is already known in this country to a person of ordinary skill in the art.

SUMMARY

An embodiment is directed to a method of manufacturing a flexible display device, the method including a first step of providing a three-dimensional cover window having a flat portion, and a curved portion that is bent in a third direction intersecting a first direction of the flat portion while extending to a second direction intersecting the first direction at both sides of the first direction, and a second step of attaching by a line contact at least one of an adhesive film, a touch panel, and a flexible display panel that are stacked at an inner surface of the cover window.

At the first step, a support that is formed in an upper part of a surface corresponding to the cover window may adsorb the cover window.

The second step may include advancing in the second direction an attachment head having an end portion corresponding to the flat portion and the curved portion in the first direction and the third direction.

The second step may further include advancing in the second direction an attachment roll that is provided at one side of the attachment head to correspond to the flat portion in the first direction.

In the advancing of the attachment roll in the second direction, attachment rolls may be provided in a pair to perform a line contact in a pair in the flat portion.

At the first step, a support that is formed in a lower portion of a surface corresponding to the cover window may adsorb the cover window.

The second step may includes revolving the support about a first rotation center in the second direction, and revolving an attachment member by revolving a variable length unit that is connected to the attachment member about a second rotation center that is separated to correspond to the first rotation center according to a revolution of the support.

At the first step, a support that is formed in an upper part of a surface corresponding to the cover window may adsorb the cover window, and, at the second step, an attachment member may be revolved by revolving a variable length unit that is connected to the attachment member about a rotation center corresponding to an upper portion of the center of the support according to a surface shape of the support.

The first step may further include fixing both ends of one of the adhesive film, the touch panel, and the flexible display panel to a fixing portion that is provided in an upper portion of the third direction of both sides of the support.

The fixing of both ends may include adjusting a tension at both ends of one of the adhesive film, the touch panel, and the flexible display panel with expansion and contraction operations of a cylinder that is connected to the fixing portion.

Embodiments are also directed to an apparatus for manufacturing a flexible display device, the apparatus including a support that has a curved portion at both sides of a flat portion and that forms a surface corresponding to an outer surface of an extended three-dimensional cover window, and a line contact body that attaches by a line contact at least one of an adhesive film, a touch panel, and a flexible display panel that are stacked at an inner surface of the cover window.

The support may include an adsorption hole that forms a surface in an upper portion to correspond to an outer surface of the cover window and that is formed in the surface, and a negative pressure chamber that provides a negative pressure to the adsorption hole.

The line contact body may include an attachment head that has an end portion corresponding to the flat portion and the curved portion.

The line contact body may further include an attachment roll that is provided at one side of the attachment head to correspond to the flat portion.

Attachment rolls may be provided in a pair to perform a line contact in a pair in the flat portion.

The support may include an adsorption hole that forms a surface corresponding to an outer surface of the cover window in a lower portion and that is formed in the surface, and a negative pressure chamber that provides a negative pressure to the adsorption hole.

The support may be connected to a first motor to revolve about a first rotation center, and the line contact body may include an attachment member that has an end portion corresponding to an elongation direction of the cover window, a variable length unit that is connected to the attachment member and that is installed at a second rotation center corresponding to the first rotation center, and a second motor that is connected to the variable length unit at the second rotation center.

The support may include an adsorption hole that forms a surface in an upper part to correspond to an outer surface of the cover window and that is formed in the surface, and a negative pressure chamber that provides a negative pressure to the adsorption hole, and the line contact body may include an attachment member that has an end portion corresponding to an elongation direction of the cover window, a variable length unit that is connected to the attachment member and that is installed in a rotation center, and a motor that is connected to the variable length unit at the rotation center.

The apparatus may further include a fixing portion that is provided in an upper portion of opposing sides of the support.

The apparatus may further include a cylinder that is connected to the fixing portion to perform expansion and contraction operations.

BRIEF DESCRIPTION OF THE DRAWINGS

Features will become apparent to those of skill in the art by describing in detail example embodiments with reference to the attached drawings in which.

DETAILED DESCRIPTION

Figure 1:
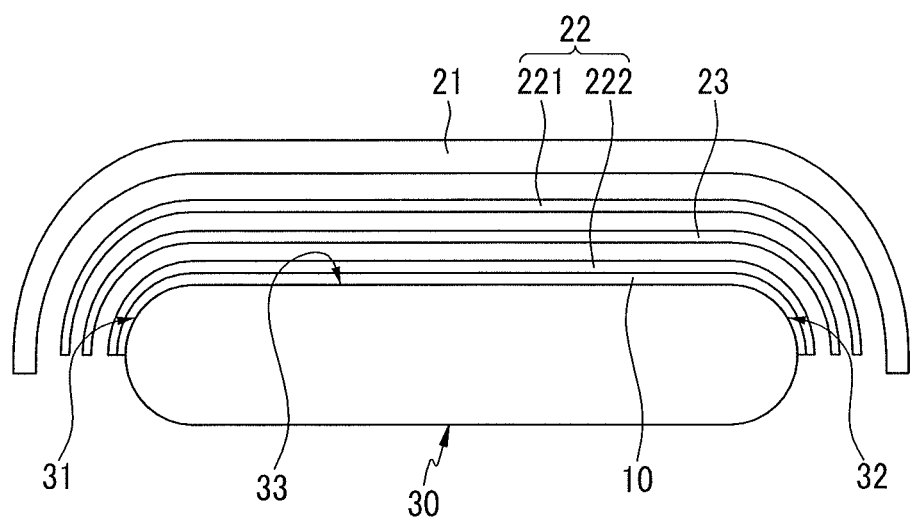
FIG. 1 is an exploded cross-sectional view of a flexible display device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "on" another element, it can be directly on the other element, or one or more intervening elements may also be present. It will also be understood that when an element is referred to as being "under" another element, it can be directly under, or one or more intervening elements may also be present. It will also be understood that when an element is referred to as being "between" two elements, it can be the only element between the two elements, or one or more intervening elements may also be present. Like reference numerals refer to like elements throughout.

FIG. 1 is an exploded cross-sectional view of a flexible display device according to an example embodiment.

In the example embodiment shown in FIG. 1, the flexible display device of the present example embodiment includes a flexible display panel 10, a cover window 21 that is overlapped with the flexible display panel 10 to protect the flexible display panel 10 from an external impact, and an adhesive film 22 that adheres the flexible display panel 10 and the cover window 21.

The flexible display panel 10 includes a flexible film such as a plastic film and displays an image by, e.g., disposing an organic light emitting diode (OLED) and a pixel circuit on the flexible film. A detailed structure of the flexible display panel 10 will be described below.

The cover window 21 is positioned at the outside of the image display side in the flexible display panel 10 and is made of a transparent hard material to protect the flexible display panel 10 from an external impact while transmitting an image of the flexible display panel 10. The cover window 21 is formed in a single layer structure or a multi-layer structure. FIG. 1 illustrates the cover window 21 of a single layer structure.

A touch panel 23 that senses a user's touch action is disposed between the flexible display panel 10 and the cover window 21. For example, when the touch panel 23 is disposed, the adhesive film 22 may include a first adhesive film 221 and a second adhesive film 222 that are disposed at both surfaces of the touch panel 23.

The first adhesive film 221 adheres the cover window 21 and the touch panel 23 at an outer surface of the touch panel 23, and the second adhesive film 222 adheres the touch panel 23 and the flexible display panel 10 at an inner surface of the touch panel 23.

The flexible display panel 10, the second adhesive film 222, the touch panel 23, the first adhesive film 221, and the cover window 21 are attached to a bracket 30 in a stacked state. Although not shown, a case encloses an outer edge of the bracket 30 and the flexible display panel 10 that is attached to the bracket 30, the second adhesive film 222, the touch panel 23, the first adhesive film 221, and the cover window 21 and covers a rear surface of the bracket 30 to fix the bracket 30.

In this case, the flexible display panel 10, the second adhesive film 222, the touch panel 23, the first adhesive film 221, and the cover window 21 are adhered in a bent state at both sides of the bracket 30.

The flexible display panel 10 is disposed at the outside of the bracket 30 to be adhered with convex curved portions 31 and 32 while being adhered with a flat portion 33. Therefore, the flexible display panel 10 displays an image at the flat portion 33 side and the curved portions 31 and 32 side of the bracket 30.

Although not shown, a flexible printed circuit (FPC) and a battery for driving the flexible display panel 10 are disposed between the bracket 30 and a support (not shown).

Figure 2:
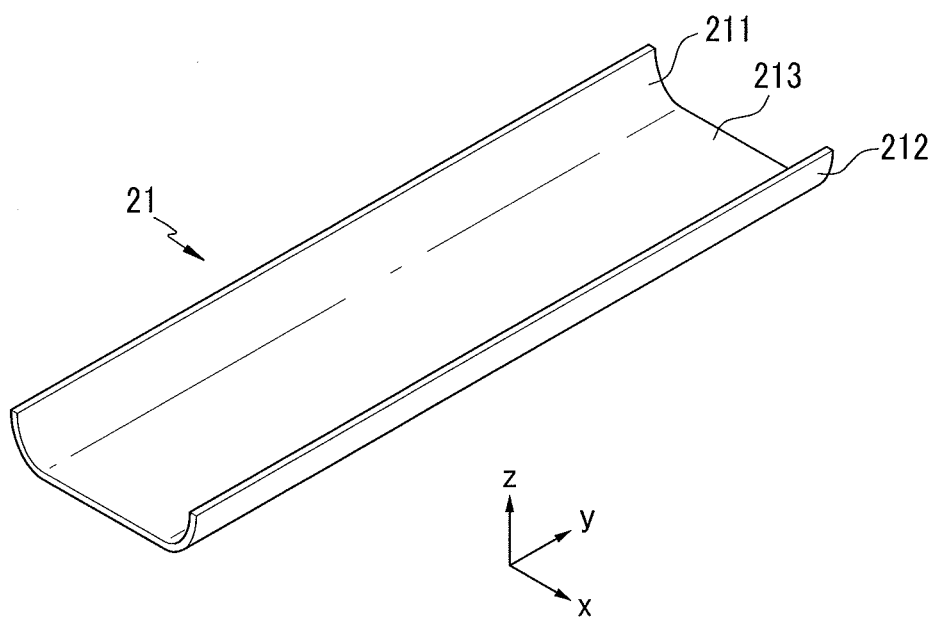
FIG. 2 is a perspective view of a cover window applied to the flexible display device of FIG. 1.
Figure 3:
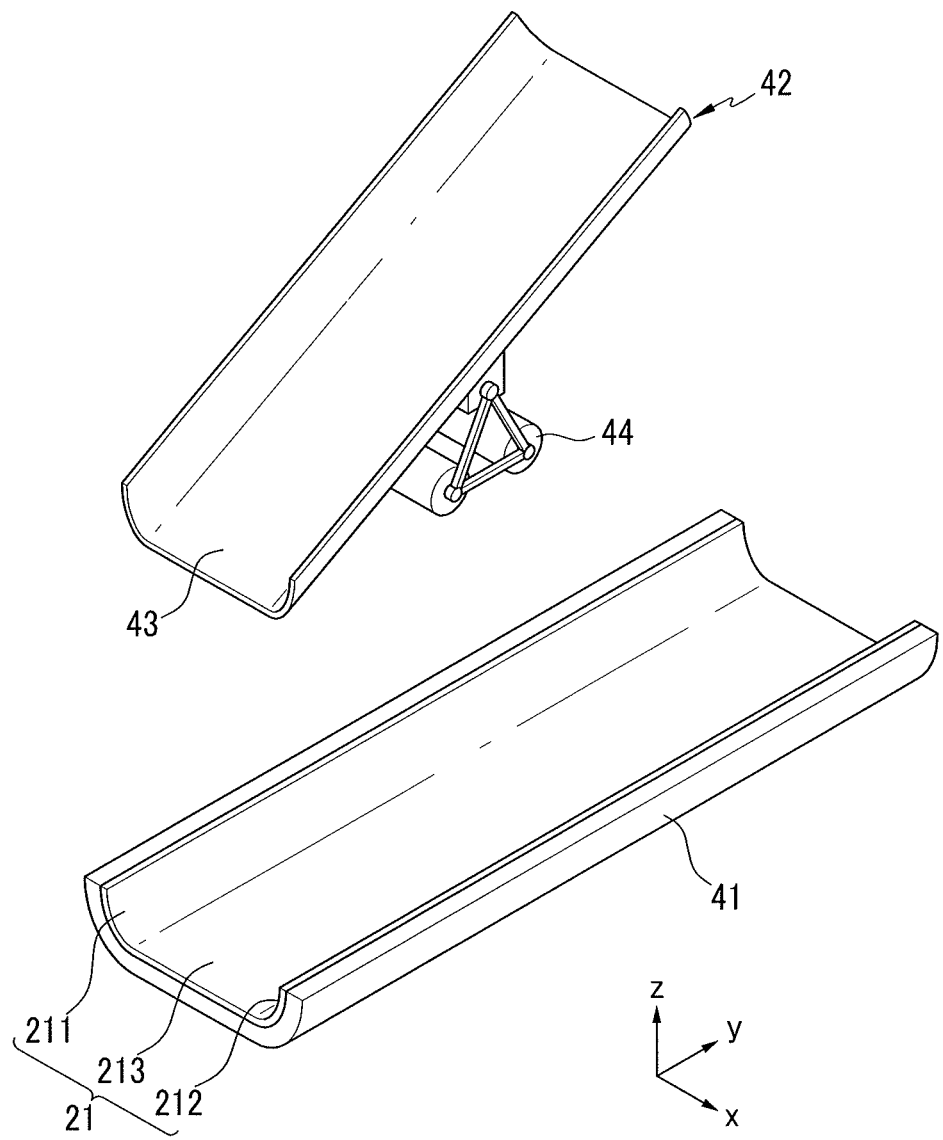
FIG. 3 is a perspective view of a manufacturing apparatus of a flexible display device according to a first example embodiment.
Figure 4A:
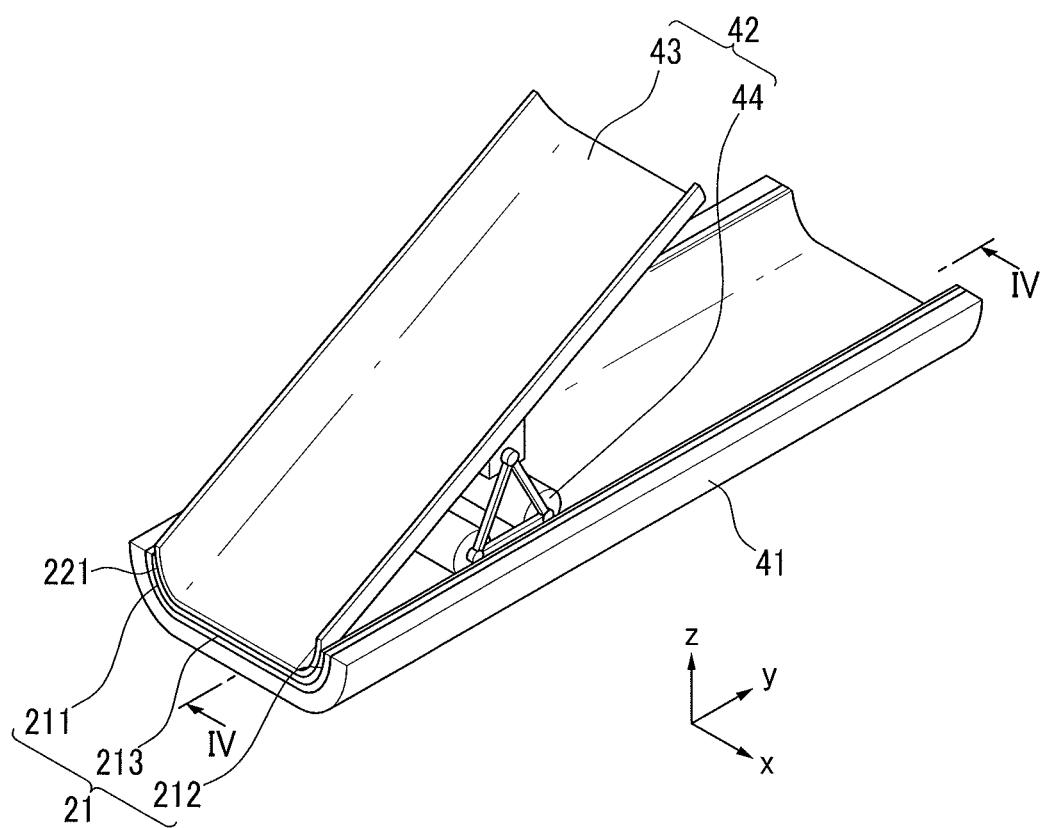
FIG. 4A is a perspective view of stage in a manufacturing method using the manufacturing apparatus of the flexible display device of FIG. 3.
Figure 4B:
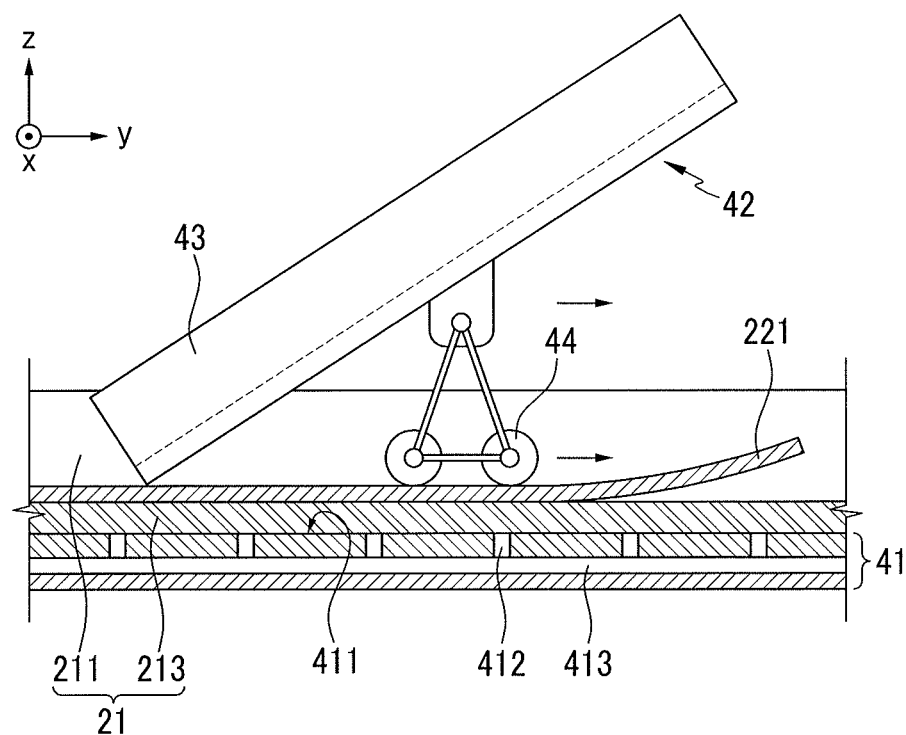
FIG. 4B is a cross-sectional view of a stage the manufacturing method using the manufacturing apparatus of the flexible display device taken along line IV-IV of FIG. 4A.

FIG. 2 is a perspective view of a cover window applied to the flexible display device of FIG. 1, FIG. 3 is a perspective view of a manufacturing apparatus of a flexible display device according to a first example embodiment, FIG. 4A is a perspective view of a stage in a manufacturing method using the manufacturing apparatus of the flexible display device of FIG. 3, and FIG. 4B is a perspective view of a stage in the manufacturing method using the manufacturing apparatus of the flexible display device taken along line IV-IV of FIG. 4A.

For convenience, a manufacturing apparatus of a flexible display device (hereinafter, referred to as a "manufacturing apparatus") of a first example embodiment and a manufacturing method (hereinafter, referred to as a "manufacturing method") using the same will be together described with reference to FIGS. 2 to 4B.

The manufacturing method of the first example embodiment includes a first step of providing a three-dimensional cover window 21 (see FIG. 2) and a second step of attaching the first adhesive film 221 to an inner surface of the cover window 21 by a line contact (see FIGS. 3, 4A, and 4B).

The first example embodiment illustrates a case of attaching the first adhesive film 221 at an inner surface of the cover window 21. Although not shown, the first example embodiment may be applied even to a case of attaching the touch panel 23 to the first adhesive film 221 that is attached to the cover window 21, attaching the second adhesive film 222 to the touch panel 23, or attaching the flexible display panel 10 to the second adhesive film 222.

For example, at the first step, by heating and compressing a sheet of a transparent hard material in a press, or by processing the cover window 21 by injection molding a transparent hard material, the cover window 21 may be provided.

The cover window 21 that is provided at the first step includes a flat portion 213 and curved portions 211 and 212. The curved portions 211 and 212 are bent in a third direction (z-axis direction) intersecting the first direction while extending in the second direction (y-axis direction) intersecting the first direction at both sides of the first direction (x-axis direction) of the flat portion 213.

Therefore, the flat portion 213 and the curved portions 211 and 212 of the cover window 21 are formed in a three-dimensional structure corresponding to the flat portion 33 and the curved portions 31 and 32, respectively of the bracket 30 in a flexible display device.

At the second step, when attaching the first adhesive film 221 to an inner surface of the three-dimensional cover window 21, a manufacturing apparatus of the first example embodiment may be used. The manufacturing apparatus of the first example embodiment includes a support 41 and a line contact body 42.

Referring to FIGS. 3, 4A, and 4B, the support 41 forms a surface 411 corresponding to an outer surface of the flat portion 213 and the curved portions 211 and 212 of the cover window 21 and houses and supports an outer surface of the three-dimensional cover window 21.

The support 41 includes an adsorption hole 412 that is formed in an upper part of the surface 411 to correspond to an outer surface of the cover window 21 and that is connected to the surface 411 and a negative pressure chamber 413 that is connected to the adsorption hole 412 to fix the cover window 21 by providing a negative pressure to the cover window 21 that is put in the surface 411 through the adsorption hole 412.

Because the adsorption hole 412 is formed to correspond to the flat portion 213 and the curved portions 211 and 212 of the cover window 21, the adsorption hole 412 securely fixes the flat portion 213 and the curved portions 211 and 212 to the support 41.

Because an absorption force operates in the cover window 21 through the adsorption hole 412, even when a line contact body 42 is advanced while being pressed on the support 41, the cover window 21 maintains a state that is fixed to the support 41.

The line contact body 42 is supported to the support 41 and is formed to attach by a line contact the first adhesive film 221 that is stacked at an inner surface of the cover window 21 that is adsorbed and fixed while advancing in a y-axis direction on the support 41.

For example, the line contact body 42 includes an attachment head 43 having an end portion corresponding to the flat portion 213 and the curved portions 211 and 212 of the cover window 21. The attachment head 43 simultaneously performs a line contact with the flat portion 213 and the curved portions 211 and 212 of the cover window 21 and attaches the first adhesive film 221 to the flat portion 213 and the curved portions 211 and 212 of the cover window 21 while advancing in an y-axis direction on the surface 411 of the support 41. Therefore, a bubble does not occur at an adhesion interface of the first adhesive film 221 and the cover window 21 of a three-dimensional structure.

Further, the line contact body 42 may further include an attachment roll 44 that is provided at one side of the attachment head 43 to correspond to the flat portion 213. The attachment roll 44 primarily attaches the first adhesive film 221 to the flat portion 213 of the cover window 21 while advancing integrally with the attachment head 43.

That is, the first adhesive film 221 is attached to the flat portion 213 by the attachment roll 44 and is attached to the curved portions 211 while being further attached to the flat portion 213 by the attachment head 43.

Further, the attachment rolls 44 are provided in a pair to perform a line contact in a pair in the flat portion 213 and more securely attach the first adhesive film 221 to the flat portion 213 of the cover window 21.

In a manufacturing method of the first example embodiment, at first step, the support 41 that forms the surface 411 corresponding to the cover window 21 in an upper part adsorbs the cover window 21.

Second step further includes an attachment head advancing step of advancing the attachment head 43 having an end portion corresponding to the flat portion 213 and the curved portions 211 and 212 in the first direction (x-axis direction) and the third direction (z-axis direction) in the second direction (y-axis direction) (see FIG. 4B).

The second step includes an attachment roll advancing step of advancing in the second direction (y-axis direction) the attachment roll 44 that is provided at one side of the attachment head 43 to correspond to the flat portion 213 in the first direction (x-axis direction) (see FIG. 4B). At the attachment roll advancing step, the attachment rolls 44 are provided in a pair, and a line contact is performed in a pair in the flat portion 213.

According to the first example embodiment, in an atmospheric pressure, the first adhesive film 221 is attached to an inner surface of the three-dimensional cover window 21 by a line contact by the support 41, the attachment head 43, and the attachment roll 44. Therefore, at an adhesion interface, a lifting phenomenon is prevented, and reliability of adhesion can be improved.

Hereinafter, various example embodiments will be described. A description of the same constituent elements as those of the first example embodiment and other example embodiments may not be repeated.

Figure 5:
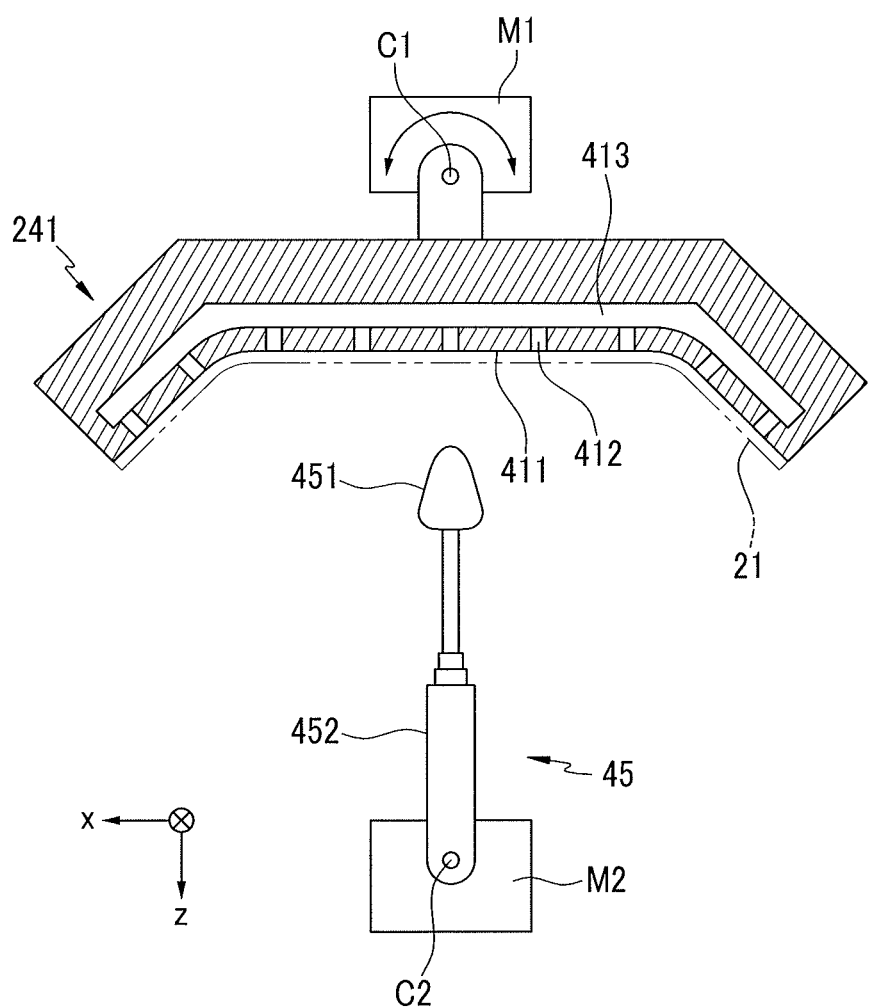
FIG. 5 is a cross-sectional view of a manufacturing apparatus of a flexible display device according to a second example embodiment.

FIG. 5 is a cross-sectional view of a manufacturing apparatus of a flexible display device according to a second example embodiment. In the manufacturing apparatus of FIG. 5, a support 241 includes an adsorption hole 412 that forms a surface 411 corresponding to an outer surface of a cover window 21 in a lower portion and that is connected to the surface 411 and a negative pressure chamber 413 that provides a negative pressure to the adsorption hole 412.

In order to revolve about a first rotation center C1, the support 241 is connected to a first motor M1, and a line contact body 45 includes an attachment member 451 that has an end portion corresponding to an elongation direction (y-axis direction) of the cover window 21, a variable length unit 452 that is connected to the attachment member 451 and that is installed at a second rotation center C2 corresponding to the first rotation center C1, and a second motor M2 that is connected to the variable length unit 452 at the second rotation center C2.

The variable length unit 452 is formed with a cylinder operating by, e.g., an oil pressure or a pneumatic pressure. The first and second motors may be replaced with a cylinder that is connected to the support 241 and the variable length unit 452 in a link structure (not shown).

Figure 6:
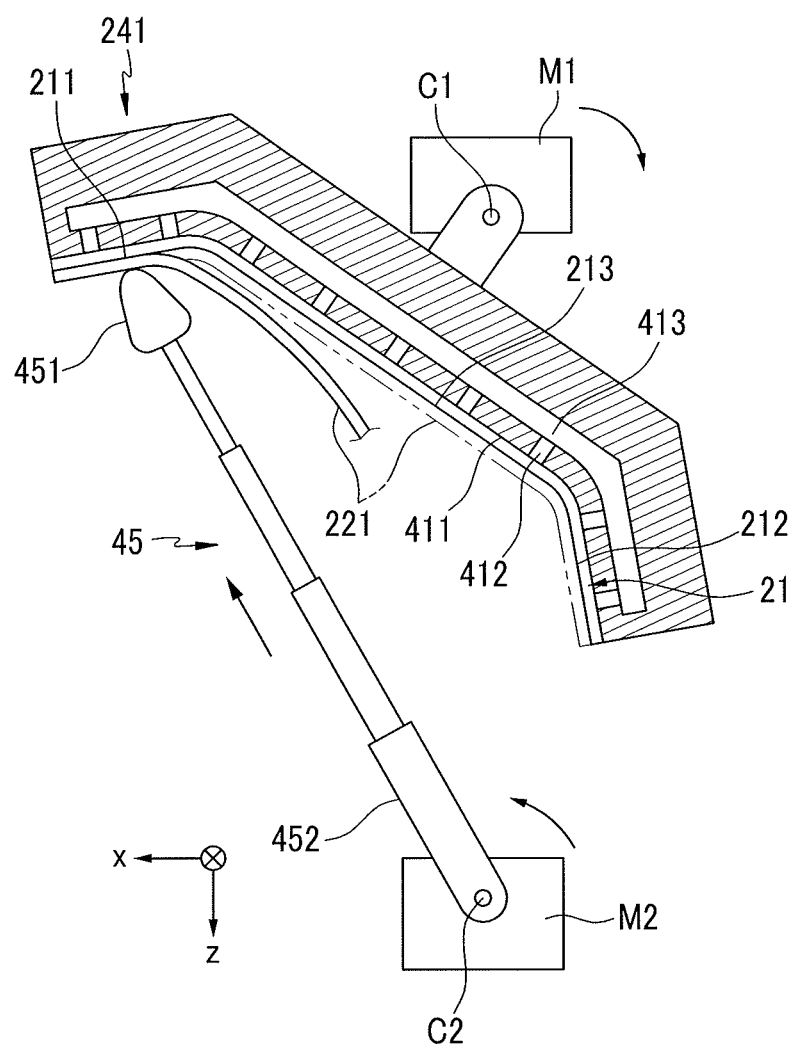
FIGS. 6 to 8 are cross-sectional views of stages in a manufacturing method using the manufacturing apparatus of the flexible display device of FIG. 5.
Figure 7:
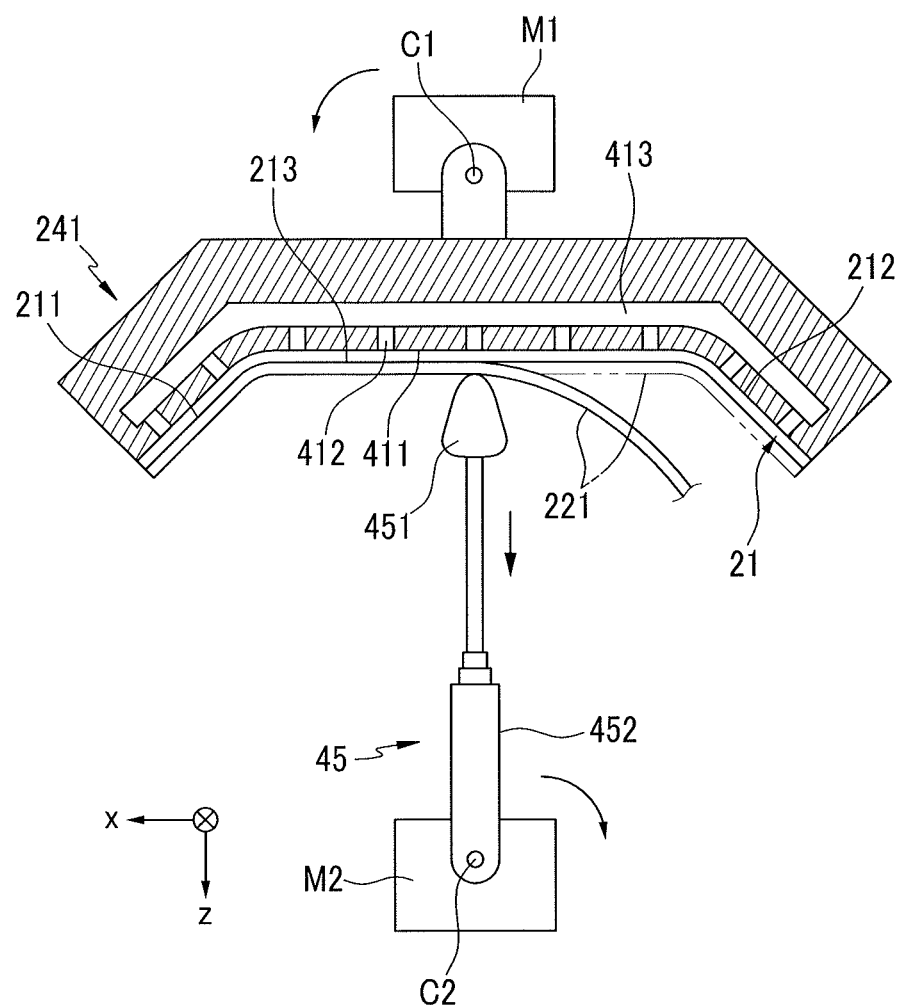
Figure 8:
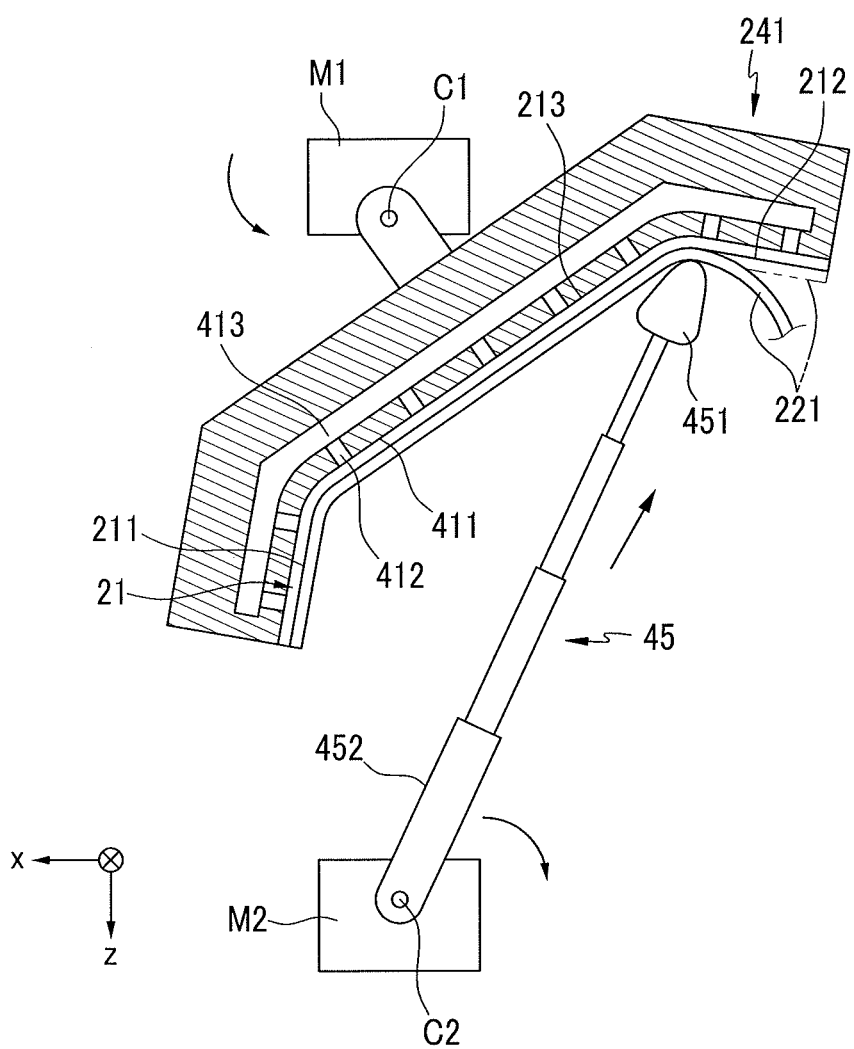

FIGS. 6 to 8 are cross-sectional views of stages in a manufacturing method using the manufacturing apparatus of the flexible display device of FIG. 5. In a manufacturing method of a second example embodiment, at a first step, the support 241 that forms the surface 411 corresponding to the cover window 21 in a lower portion adsorbs the cover window 21 (see FIG. 5).

A second step includes a support revolving step of revolving the support 241 about the first rotation center C1 in the second direction (y-axis direction) and an attachment member revolving step of revolving the attachment member 451 by revolving the variable length unit 452 that is connected to the attachment member 451 about the second rotation center C2 that is separated to correspond to the first rotation center C1 (see FIGS. 6 to 8) according to a revolution of the support 241.

Referring to FIG. 6, in a state of FIG. 5, the motor M1 turns to the right, and thus while the second motor M2 turns to the left, the variable length unit 452 is extended. Therefore, the attachment member 451 attaches a first adhesive film 221 to a curved portion 211 of the cover window 21 at an upper end portion of the left side.

Referring to FIG. 7, in a state of FIG. 6, the first motor M1 turns to the left, and thus while the second motor M2 turns to the right, the variable length unit 452 is contracted. Therefore, the attachment member 451 attaches the first adhesive film 221 to a flat portion 213 of the cover window 21 at the center.

Referring to FIG. 8, in a state of FIG. 7, the first motor M1 turns to the left, and thus while the second motor M2 turns to the right, the variable length unit 452 is again extended. Therefore, the attachment member 451 attaches the first adhesive film 221 to a curved portion 212 of the cover window 21 in an upper end portion of the right side.

Figure 9:
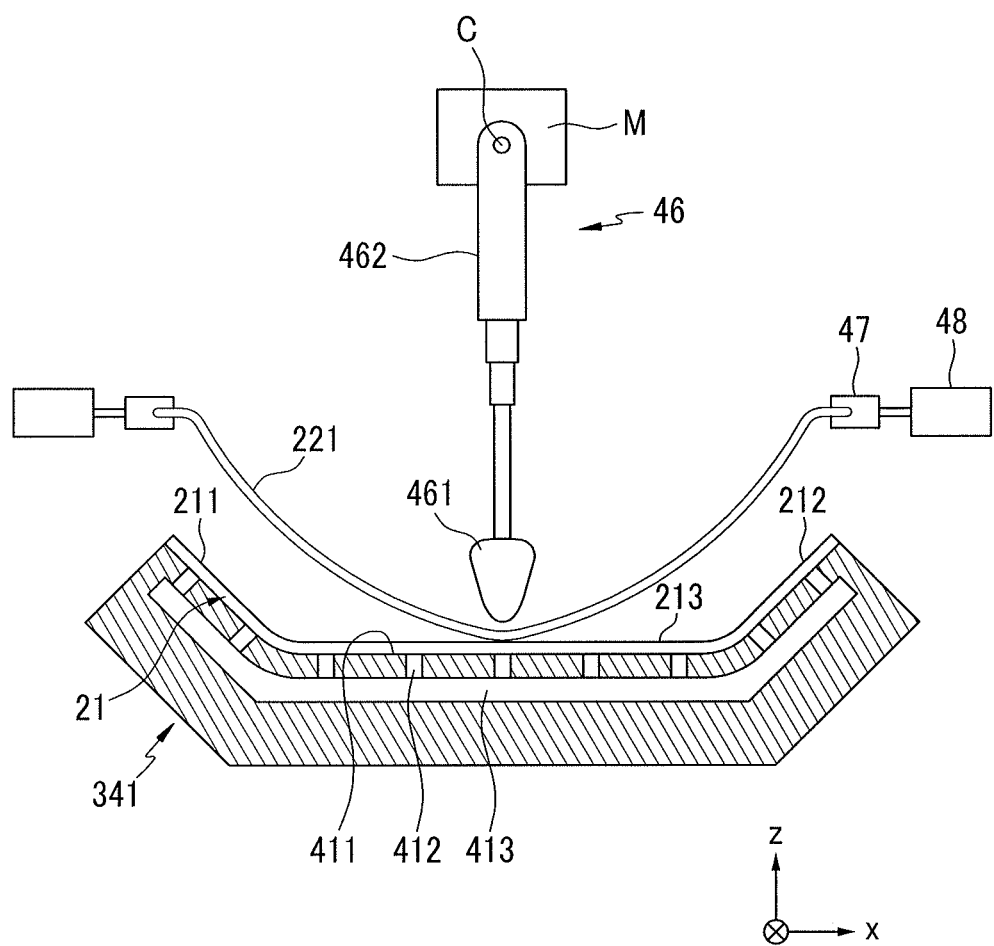
FIGS. 9 to 11 are cross-sectional views of stages in a manufacturing method using a manufacturing apparatus of a flexible display device according to a third example embodiment.
Figure 10:
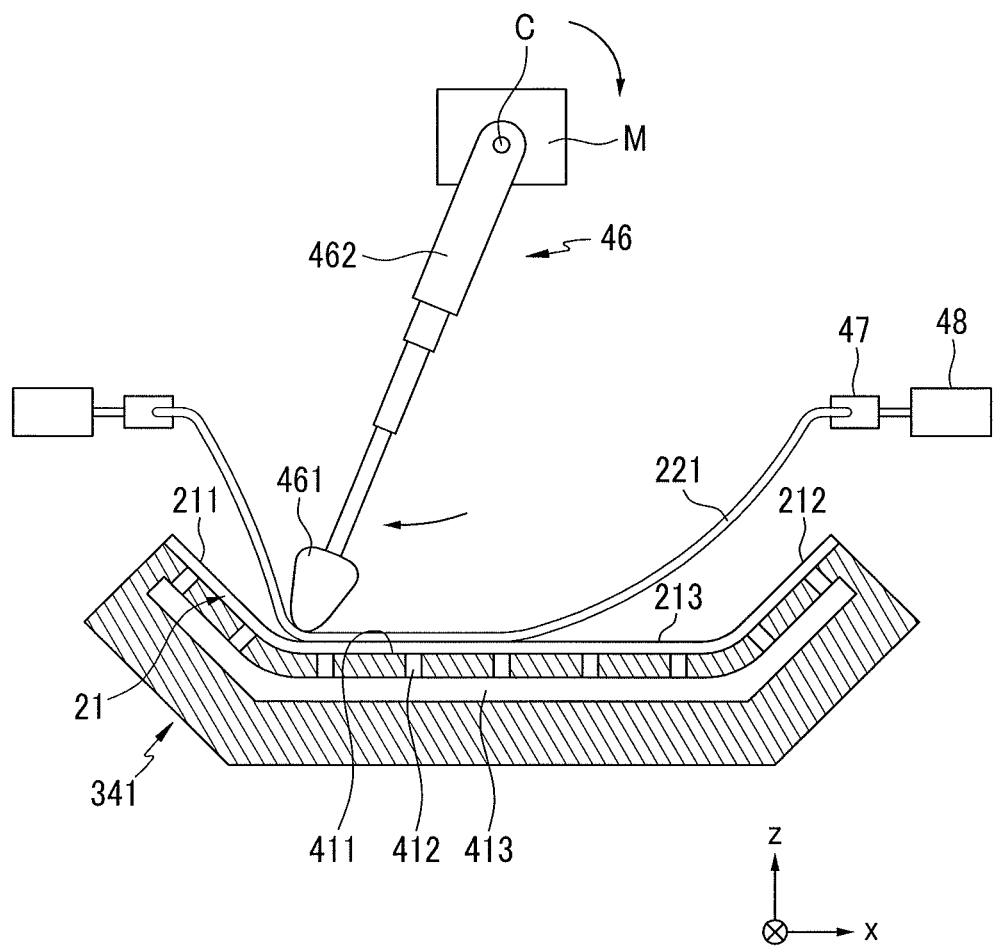
Figure 11:
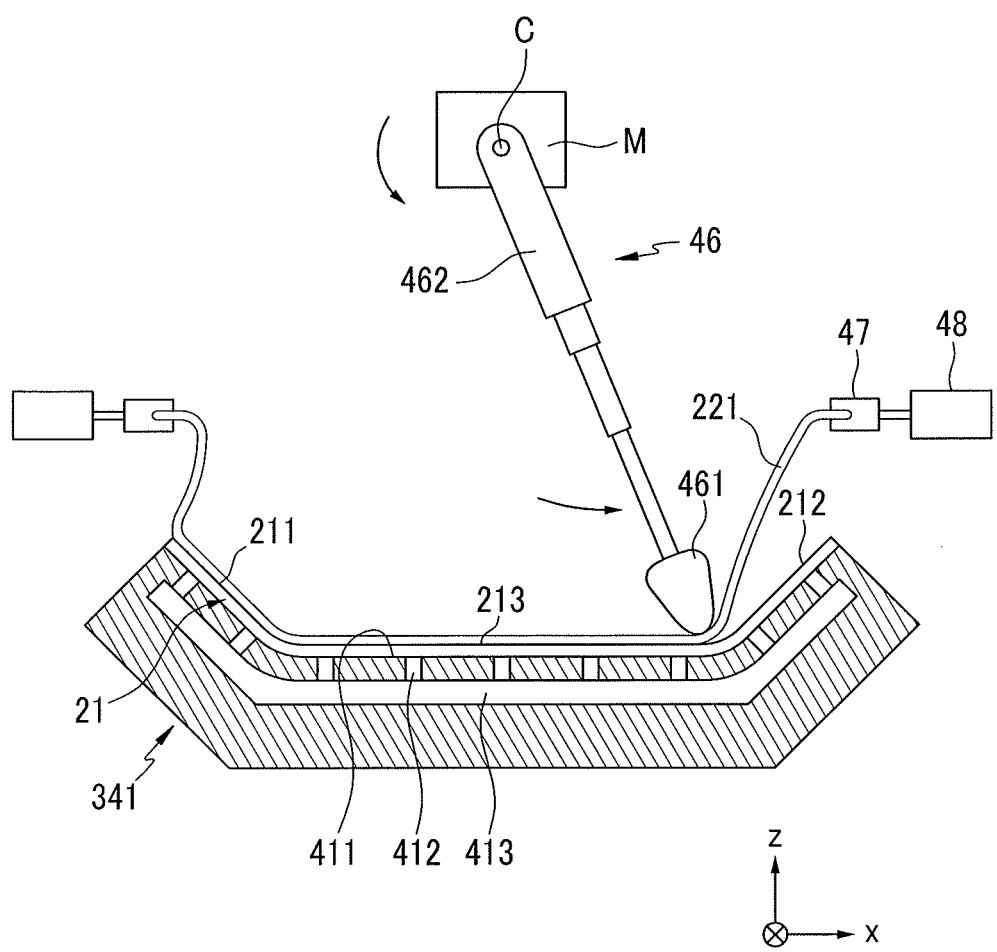

FIGS. 9 to 11 are cross-sectional views of stages in a manufacturing method using a manufacturing apparatus of a flexible display device according to a third example embodiment. In the manufacturing apparatus of FIG. 9, a support 341 includes an adsorption hole 412 that forms a surface 411 in an upper part to correspond to an outer surface of a cover window 21 and that is connected to the surface 411 and a negative pressure chamber 413 that provides a negative pressure to the adsorption hole 412.

A line contact body 46 includes an attachment member 461 that has an end portion corresponding to an elongation direction (y-axis direction) of the cover window 21, a variable length unit 462 that is connected to the attachment member 461 and that is installed at a rotation center C, and a motor M that is connected to the variable length unit 462 at the rotation center C.

The manufacturing apparatus of the third example embodiment further includes a fixing portion 47 that is provided in an upper portion of both sides of the support 341. The manufacturing apparatus of the third example embodiment may further include a cylinder 48 that is connected to the fixing portion 47 to perform expansion and contraction operations.

In a manufacturing method of the third example embodiment, at a first step, the support 341 that forms the surface 411 corresponding to the cover window 21 in an upper part adsorbs the cover window 21 (see FIG. 9).

The first step may further include a fixing step of fixing both ends of a first adhesive film 221 to the fixing portion 47 that is provided in an upper side of a third direction (z-axis direction) of both sides of the support 341 (see FIG. 9). Although not shown, the first adhesive film 221, which is a fixing target, may be replaced with a second adhesive film, a touch panel, or a flexible display panel.

The fixing step may further include a tension adjustment step of adjusting a tension at both ends of the first adhesive film 221 with expansion and contraction operations of the cylinder 48 that is connected to the fixing portion 47.

At a second step, by revolving the variable length unit 462 that is connected to the attachment member 461 about the rotation center C corresponding to an upper portion of the center of the support 341 according to a shape of the surface 411 of the support 341, the attachment member 461 is revolved.

A tension adjustment step may be completed before the second step and may adjust a tension of the first adhesive film 221 to correspond to an operation state of the line contact body 46 even while performing the second step.

Referring to FIG. 9, the motor M stops, and the variable length unit 462 is extended. Therefore, the attachment member 461 attaches the first adhesive film 221 to a flat portion 213 of the cover window 21 at the center.

Referring to FIG. 10, in a state of FIG. 9, the motor M turns to the right, and thus the variable length unit 462 is extended. Therefore, the attachment member 461 attaches the first adhesive film 221 to the flat portion 213 and the curved portion 211 of the cover window 21 while moving from the center to the left side.

Referring to FIG. 11, after the motor M and the variable length unit 462 are returned to a state of FIG. 9, the motor M turns to the left in the state of FIG. 9, and thus the variable length unit 462 is extended. Therefore, while the attachment member 461 moves from the center to the right side, the attachment member 461 attaches the first adhesive film 221 to the flat portion 213 and a curved portion 212 of the cover window 21.

Hereinafter, an example of the flexible display panel 10 that is disposed at an inner side of the cover window 21 will be described.

Figure 12:
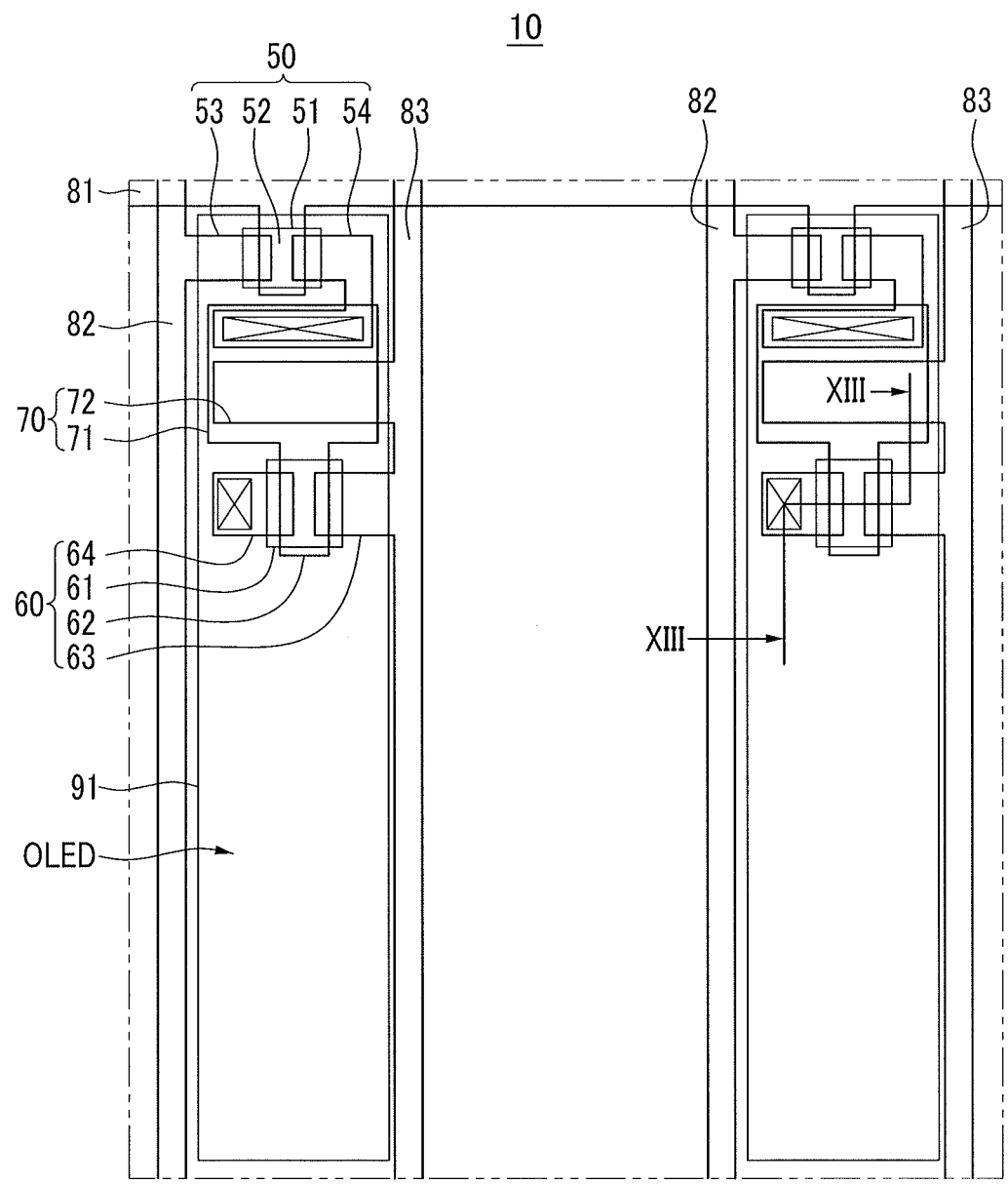
FIG. 12 is a layout view of a pixel structure of the flexible display panel of FIG. 1.
Figure 13:
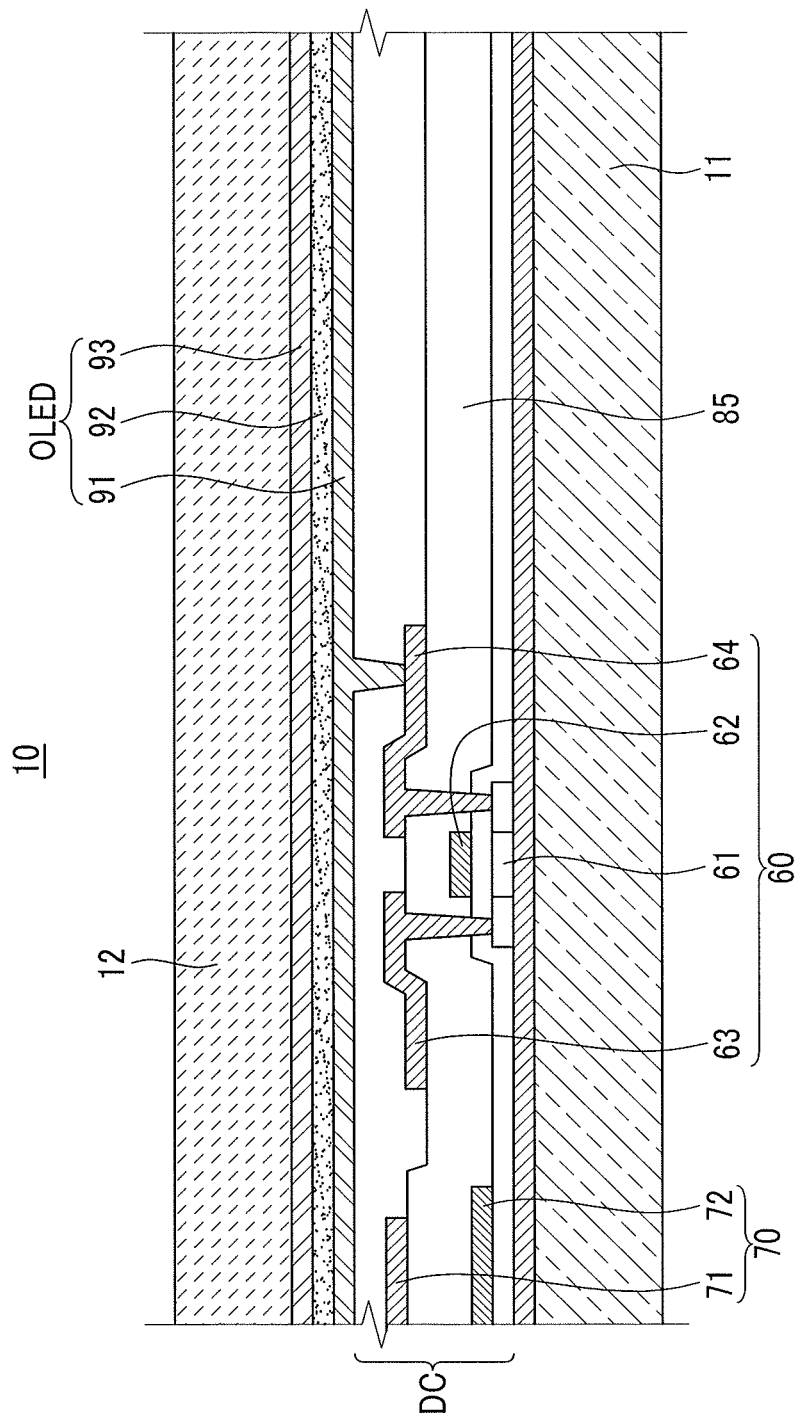
FIG. 13 is a cross-sectional view of the flexible display panel taken along line XIII-XIII of FIG. 12.

FIG. 12 is a layout view of a pixel structure of the flexible display panel of FIG. 1, and FIG. 13 is a cross-sectional view of the flexible display panel taken along line XIII-XIII of FIG. 12. The flexible display panel 10 is not limited to the structure described herein and may be formed as, e.g., a flexible liquid crystal display (LCD) or an organic light emitting diode (OLED) display of another structure.

Referring to FIGS. 12 and 13, the flexible display panel 10 includes a pixel circuit (DC) and an OLED that are formed in each pixel. The DC generally includes a switching thin film transistor 50, a driving thin film transistor 60, and a capacitor 70. The flexible display panel 10 includes a gate line 81 that is disposed in one direction and a data line 82 and a common power supply line 83 that are insulated from and that intersect the gate line 81.

Here, one pixel may be defined using the gate line 81, the data line 82, and the common power supply line 83 as a boundary. A pixel is a basic unit for displaying an image, and the flexible display panel 10 displays an image through a plurality of pixels.

FIG. 12 illustrates an active matrix flexible display panel 10 of a 2Tr-1Cap structure having two thin film transistors 50 and 60 and one capacitor 70 at one pixel, but a structure of the flexible display panel 10 is not limited to the illustrated example. The flexible display panel 10 may include three or more thin film transistors and two or more capacitors, and may be formed in various structures, as a separate wire is further formed.

The OLED includes a pixel electrode 91, an organic emission layer 92, and a common electrode 93. One of the pixel electrode 91 and the common electrode 93 is a hole injection electrode, and the other one is an electron injection electrode.

Electrons and holes are injected from the pixel electrode 91 and the common electrode 93 to the organic emission layer 92, and when excitons in which holes and electrons are coupled drop from an exited state to a ground state, light is emitted.

The organic emission layer 92 may be made of a low polymer organic material or a high polymer organic material such as poly 3,4-ethylenedioxythiophene (PEDOT). Further, the organic emission layer 92 may be formed in a multilayer including at least one of an emission layer, a hole injection layer (HIL), a hole transporting layer (HTL), an electron transporting layer (ETL), and an electron injection layer (EIL). When the organic emission layer 92 includes all of them, the HIL is disposed on the pixel electrode 91, which is a positive electrode, and the HTL, the emission layer, the ETL, and the EIL are sequentially stacked on the pixel electrode 91.

The organic emission layer 92 includes a red organic emission layer that emits red, a green organic emission layer that emits green, and a blue organic emission layer that emits blue, and the red organic emission layer, the green organic emission layer, and the blue organic emission layer are formed in a red pixel, a green pixel, and a blue pixel, respectively, to embody a color image.

Further, the organic emission layer 92 stacks the red organic emission layer, the green organic emission layer, and the blue organic emission layer in a red pixel, a green pixel, and a blue pixel, respectively, and forms a red filter, a green filter, and a blue filter on a pixel basis, thereby embodying a color image. In another example, a white organic emission layer that emits white is formed in all of the red pixel, the green pixel, and the blue pixel, and by forming each of a red filter, a green filter, and a blue filter on a pixel basis, a color image may be embodied. When a color image is embodied using the white organic emission layer and the color filter, a deposition mask for depositing the red organic emission layer, the green organic emission layer, and the blue organic emission layer at respective individual pixels, i.e., the red pixel, the green pixel, and the blue pixel may not be used.

The white organic emission layer that is described in another example may be formed in an organic emission layer and includes a configuration that is formed to emit white by stacking a plurality of organic emission layers. For example, a white organic emission layer may include a configuration that emits white by combining at least one yellow organic emission layer and at least one blue organic emission layer, a configuration that emits white by combining at least one cyan organic emission layer and at least one red organic emission layer, and a configuration that emits white by combining at least one magenta organic emission layer and at least one green organic emission layer.

The pixel electrode 91 is made of a metal having high reflectivity, and the common electrode 93 is formed with a transparent conductive layer. In this case, light of the organic emission layer 92 is reflected by the pixel electrode 91 and transmits the common electrode 93 and an encapsulation substrate 12 to be emitted to the outside. In FIG. 13, reference numeral 11 indicates a flexible substrate.

The capacitor 70 includes a pair of capacitor electrodes 71 and 72 with an interlayer insulating layer 85, which is a dielectric material, interposed therebetween. A capacitor capacity depends on a voltage between charges that are stored at the capacitor 70 and two capacitor electrodes 71 and 72.

The switching thin film transistor 50 includes a switching semiconductor layer 51, a switching gate electrode 52, a switching source electrode 53, and a switching drain electrode 54. The driving thin film transistor 60 includes a driving semiconductor layer 61, a driving gate electrode 62, a driving source electrode 63, and a driving drain electrode 64.

The switching semiconductor layer 51 and the driving semiconductor layer 61 are formed with polysilicon or an oxide semiconductor. The oxide semiconductor may include one of an oxide using titanium (Ti), hafnium (Hf), zirconium (Zr), aluminum (Al), tantalum (Ta), germanium (Ge), zinc (Zn), gallium (Ga), tin (Sn), or indium (In) as a base, and zinc oxide (ZnO), indium-gallium-zinc oxide ($InGaZnO_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O), which are complex oxides thereof.

The switching semiconductor layer 51 and the driving semiconductor layer 61 include a channel area that is not doped with impurities and a source area and a drain area that are doped with impurities at both sides of the channel area. Here, such impurities change according to a kind of a thin film transistor and may be an N-type impurity or a P-type impurity.

When the switching semiconductor layer 51 and the driving semiconductor layer 61 are formed with an oxide semiconductor, in order to protect an oxide semiconductor (which may be weak against an external environment such as exposure to a high temperature), a separate protective layer may be added.

The switching thin film transistor 50 is used as a switch that selects a pixel to emit light. The switching gate electrode 52 is connected to the gate line 81. The switching source electrode 53 is connected to the data line 82, and the switching drain electrode 54 is connected to any one capacitor electrode 71.

The driving thin film transistor 60 applies driving power for enabling the organic emission layer 92 of a selected pixel to emit light to the pixel electrode 91. The driving gate electrode 62 is connected to the capacitor electrode 71 that is connected to the switching drain electrode 54. The driving source electrode 63 and the other capacitor electrode 72 are connected to the common power supply line 83. The driving drain electrode 64 is connected to the pixel electrode 91 of an OLED through a contact hole.

The switching thin film transistor 50 operates by a gate voltage that is applied to the gate line 81 to transfer a data voltage that is applied to the data line 82 to the driving thin film transistor 60. A voltage corresponding to a difference between a common voltage that is applied from the common power supply line 83 to the driving thin film transistor 60 and a data voltage that is transferred from the switching thin film transistor 50 is stored at the capacitor 70, and a current corresponding to the voltage that is stored at the capacitor 70 flows to the OLED through the driving thin film transistor 60 and thus the organic emission layer 92 emits light.

By way of summation and review, a flexible display device may have a cover window at an uppermost portion of the stacked panel, in order to protect a flexible display panel. The cover window is formed in a two-dimensional plane structure, and thus the cover window may be adhered with the flexible display panel by an atmospheric pressure rolling attaching method or a vacuum surface compression method. In the atmospheric pressure rolling attaching method and the vacuum surface compression method, when a flexible display panel is adhered with a cover window that is formed in a three-dimensional structure, a bubble may occur upon adhering and thus a quality of the flexible display device may be deteriorated. In the atmospheric pressure rolling attaching method, a two-dimensional cover window may be bent to be attached to a flexible display panel. However, when the cover window is formed in a three-dimensional structure, a three-dimensional processing of a roller corresponding to the cover window may be difficult, and thus it may be difficult to adhere the three-dimensional cover window with the flexible display panel by the atmospheric pressure rolling attaching method. In the vacuum surface compression method, the three-dimensional cover window may be attached to the flexible display panel in a three-dimensional form, but an equipment cost may increase according to a configuration of a vacuum chamber. Further, when an adhesive film is attached with an atmospheric pressure rolling attaching method or a vacuum surface compression method, at a three-dimensional curved surface of the cover window, a lifting phenomenon of the adhesive film may occur. That is, adhesion reliability may be lowered.

As described above, embodiments may provide a method of manufacturing a flexible display device having advantages of adhering an adhesive film, a touch panel, and a flexible display panel that are stacked at an inner surface of a cover window of a three-dimensional form in an atmospheric pressure. Embodiments may further provide an apparatus for manufacturing the flexible display device that is used in the manufacturing method. According to an example embodiment, by attaching, by a line contact, one of an adhesive film, a touch panel, and a flexible display panel that are stacked at an inner surface of a three-dimensional cover window in an atmospheric pressure, a lifting phenomenon at an adhesion interface may be prevented. Therefore, reliability of adhesion may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

<Description of symbols>

| | |
|---|---|
| 10: flexible display panel | 21: cover window |
| 22: adhesive film | 23: touch panel |
| 30: bracket | 31, 32: curved portion |
| 33: flat portion | 41, 241, 341: support |
| 42, 46: line contact body | 43: attachment head |
| 44: attachment roll | 45: line contact body |
| 47: fixing portion | 48: cylinder |
| 213: flat portion | 211, 212: curved portion |

<Description of symbols>

| | |
|---|---|
| 221, 222: first and second adhesive films | 411: surface |
| 412: adsorption hole | 413: negative pressure chamber |
| 451, 461: attachment member | 452, 462: variable length unit |
| C: rotation center | C1, C2: first and second rotation center |
| M: motor | M1, M2: first and second motor |

What is claimed is:

1. An apparatus for manufacturing a flexible display device, the apparatus comprising:
   a support that has a curved portion at both sides of a flat portion and that forms a surface corresponding to an outer surface of an extended three-dimensional cover window, the support including:
      an adsorption hole that forms a surface in an upper part to correspond to an outer surface of the cover window or forms a surface corresponding to the outer surface of the cover window in a lower portion; and
      a negative pressure chamber that provides a negative pressure to the adsorption hole, the negative pressure chamber corresponding to the flat portion
   and a portion of the curved portion; and
   a line contact body that attaches by a line contact at least one of an adhesive film, a touch panel, and a flexible display panel that are stacked at an inner surface of the cover window, wherein the absorption hole forms a surface in the upper part to correspond to the outer surface of the cover window; and the line contact body includes:
      an attachment member that has an end portion corresponding to an elongation direction of the cover window;
      a variable length unit that is connected to the attachment member and that is installed in a rotation center; and
      a motor that is connected to the variable length unit at the rotation center.

2. A method of manufacturing a flexible display device using the apparatus as claimed in claim 1, the method comprising:
   a first step of providing the extended three-dimensional cover window having a flat portion; and a curved portion that is bent in a third direction intersecting a first direction of the flat portion while extending to a second direction intersecting the first direction at both sides of the first direction; and
   a second step of attaching by a line contact at least one of the adhesive film, the touch panel, and the flexible display panel that are stacked at the inner surface of the cover window.

3. The method as claimed in claim 2, wherein at the first step, the support that is formed in an upper part of a surface corresponding to the cover window adsorbs the cover window.

4. The method as claimed in claim 2, wherein the second step includes advancing in the second direction an attachment head having an end portion corresponding to the flat portion and the curved portion in the first direction and the third direction.

5. The method as claimed in claim 4, wherein the second step further includes advancing in the second direction an attachment roll that is provided at one side of the attachment head to correspond to the flat portion in the first direction.

6. The method as claimed in claim 5, wherein in the advancing of the attachment roll in the second direction, attachment rolls are provided in a pair to perform a line contact in a pair in the flat portion.

7. The method as claimed in claim 2, wherein at the first step, the support that is formed in a lower portion of a surface corresponding to the cover window adsorbs the cover window.

8. The method as claimed in claim 7, wherein the second step includes:
   revolving the support about a first rotation center in the second direction; and
   revolving an attachment member by revolving a variable length unit that is connected to the attachment member about a second rotation center that is separated to correspond to the first rotation center according to a revolution of the support.

9. The method as claimed in claim 2, wherein:
   at the first step, the support that is formed in an upper part of a surface corresponding to the cover window adsorbs the cover window, and
   at the second step, an attachment member is revolved by revolving a variable length unit that is connected to the attachment member about a rotation center corresponding to an upper portion of the center of the support according to a surface shape of the support.

10. The method as claimed in claim 9, wherein the first step further includes fixing both ends of one of the adhesive film, the touch panel, and the flexible display panel to a fixing portion that is provided in an upper portion of the third direction of both sides of the support.

11. The method as claimed in claim 10, wherein the fixing of both ends includes adjusting a tension at both ends of one of the adhesive film, the touch panel, and the flexible display panel with expansion and contraction operations of a cylinder that is connected to the fixing portion.

12. The apparatus as claimed in claim 1, wherein
   the adsorption hole forms a surface in the upper part to correspond to the outer surface of the cover window.

13. An apparatus for manufacturing a flexible display device, the apparatus comprising:
   a support that has a curved portion at both sides of a flat portion and that forms a surface corresponding to an outer surface of an extended three-dimensional cover window; and
   a line contact body that attaches by a line contact at least one of an adhesive film, a touch panel, and a flexible display panel that are stacked at an inner surface of the cover window, the line contact body including:
      an attachment head that has an end portion corresponding to the flat portion and the curved portion; and
      an attachment roll that is provided at one side of the attachment head to correspond to the flat portion.

14. The apparatus as claimed in claim 13, wherein attachment rolls are provided in a pair to perform a line contact in a pair in the flat portion.

15. The apparatus as claimed in claim 1, wherein
   the adsorption hole forms a surface corresponding to the outer surface of the cover window in a lower portion.

16. An apparatus, the apparatus comprising:
   a support that has a curved portion at both sides of a flat portion and that forms a surface corresponding to an outer surface of an extended three-dimensional cover window; and
   a line contact body that attaches by a line contact at least one of an adhesive film, a touch panel, and a flexible display panel that are stacked at an inner surface of the cover window,
   wherein:
   the support is connected to a first motor to revolve about a first rotation center, and
   the line contact body includes:
      an attachment member that has an end portion corresponding to an elongation direction of the cover window;
      a variable length unit that is connected to the attachment member and that is installed at a second rotation center corresponding to the first rotation center; and
      a second motor that is connected to the variable length unit at the second rotation center.

17. The apparatus as claimed in claim 1, further comprising a fixing portion that is provided in an upper portion of opposing sides of the support.

18. The apparatus as claimed in claim 17, further comprising a cylinder that is connected to the fixing portion to perform expansion and contraction operations.

* * * * *